United States Patent [19]

Tehrani et al.

[11] Patent Number: 5,427,965
[45] Date of Patent: Jun. 27, 1995

[54] METHOD OF FABRICATING A COMPLEMENTARY HETEROJUNCTION FET

[75] Inventors: Saied N. Tehrani, Scottsdale; X. T. Zhu, Chandler; Herbert Goronkin, Tempe; Jun Shen, Phoenix, all of Ariz.

[73] Assignee: Motorola, Inc., Schaumburg, Ill.

[21] Appl. No.: 262,292

[22] Filed: Jun. 20, 1994

Related U.S. Application Data

[62] Division of Ser. No. 119,554, Sep. 13, 1993, Pat. No. 5,349,214.

[51] Int. Cl.⁶ ............... H01L 21/265; H01L 21/20
[52] U.S. Cl. ....................... 437/41; 437/912; 437/133; 148/DIG. 15; 148/DIG. 72; 148/DIG. 160
[58] Field of Search ............... 148/DIG. 15, DIG. 67, 148/DIG. 72, DIG. 160; 437/912, 133, 977, 41, 40

[56] References Cited

U.S. PATENT DOCUMENTS

| | | | |
|---|---|---|---|
| 4,371,884 | 2/1983 | Esaki et al. | |
| 4,532,533 | 7/1985 | Jackson et al. | |
| 5,041,393 | 8/1991 | Ahearns et al. | 437/912 |
| 5,100,831 | 3/1992 | Kuwata | 148/DIG. 72 |
| 5,118,637 | 6/1992 | Ishikawa | 437/41 |
| 5,142,349 | 8/1992 | Zhu et al. | |
| 5,192,698 | 3/1993 | Schuermeyer et al. | 148/DIG. 72 |
| 5,221,849 | 6/1993 | Goronkin et al. | |
| 5,243,206 | 9/1993 | Zhu et al. | |
| 5,298,441 | 3/1994 | Goronkin et al. | 437/133 |

OTHER PUBLICATIONS

C. Nguyen, et al., Appl. Phys. Lett., vol. 60, #15 Apr. 13, 1992 pp. 1854–1856, "Surface Donor Contribution ... InAs–AlSb QW".

C. Nguyen, et al., J. Vac. Sci. Technol., B11(4) Jul. 8, 1993, pp. 1706–1709, "Surface-layer Modulation ... in InAs–AlSb QW".

J. Shen, et al., Phys. Rev. B, 46(11), Sep. 15, 1992, pp. 6938–6946 "Deep levels in type-II InAslGaSb Superlattices".

C. Nguyen, et al., J. Electron. Mater., 22(2), 1993 pp. 255–258, "Growth of InAs–AlSb QW Having ... ".

J. Shen, et al., J. Appl. Phys., 73(12), Jun. 15, 1993 pp. 8313–8318, "Remote n-type Modulation Doping of InAs QW ... ".

*Primary Examiner*—Brian E. Hearn
*Assistant Examiner*—Leon Radomsky
*Attorney, Agent, or Firm*—Eugene A. Parsons

[57] ABSTRACT

A heterojunction device including a first semiconductive layer on a substrate, a barrier layer on the first layer, a second semiconductive layer on the barrier layer and a multi-layer cap, on the second semiconductive layer. First and second gates positioned on layers of the cap to define first and second transistors, with the cap layers being selected and etched to pin the Fermi level in a first transistor conduction channel in the second semiconductive layer such that the number of carriers in the first conduction channel are substantially less than the number of carriers in surrounding portions of the second semiconductive layer and the Fermi level in a second transistor conduction channel in the first semiconductive layer such that the number of carriers in the second conduction channel are substantially less than the number of carriers in surrounding portions of the first semiconductive layer.

13 Claims, 4 Drawing Sheets

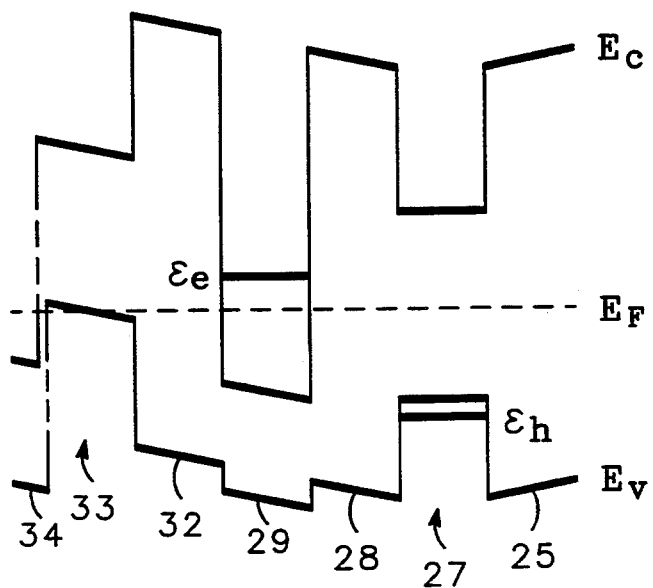
*FIG. 8*
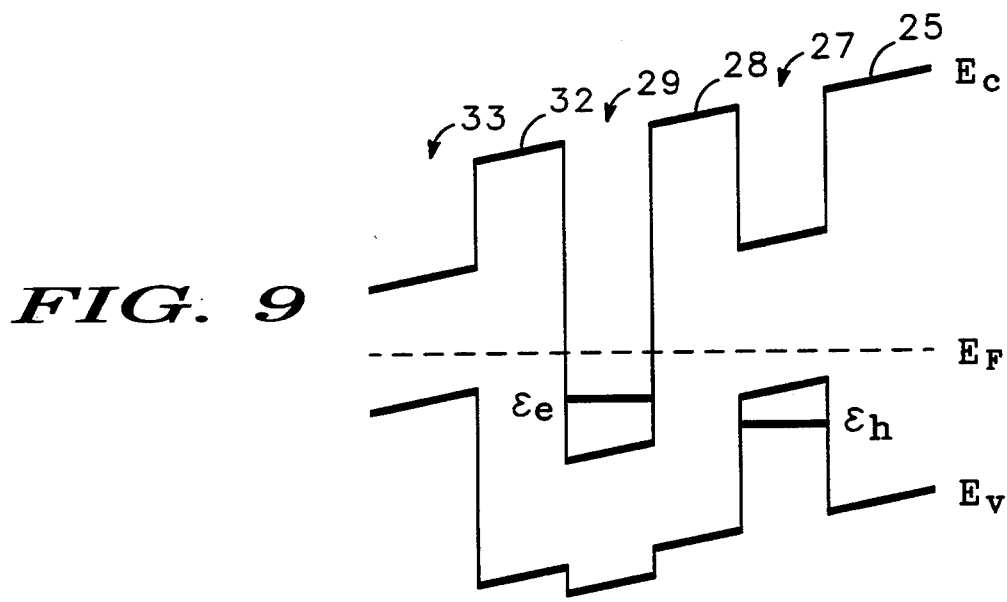
*FIG. 9*
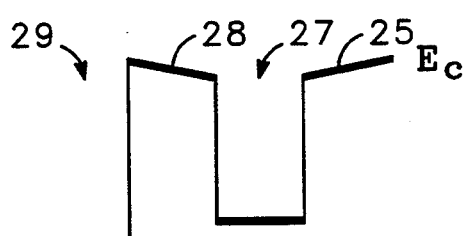
*FIG. 10*
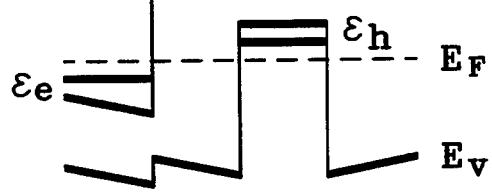

METHOD OF FABRICATING A COMPLEMENTARY HETEROJUNCTION FET

This is a division of application Ser. No. 08/119,554, filed Sep. 13, 1993, now U.S. Pat. No. 5,349,214.

FIELD OF THE INVENTION

The present invention pertains to heterojunction devices and more specifically to plural transistor devices not utilizing implants to form the different conductivity areas.

BACKGROUND OF THE INVENTION

At the present time, many compound materials, such as indium arsenide (InAs), gallium antimonide (GaSb), aluminum antimonide (AlSb), aluminum arsenide (AlAs) and the like are utilized in the formation of heterojunction transistors, generally referred to as a heterojunction FET (field effect transistor) or simply a HFET. InAs/GaSb/AlSb based heterojunction devices show great promise for electronic applications. The InAs channel FET with AlSb or AlGaSb barriers has a very high mobility ($\simeq$33,000 cm$^2$/V-s) and saturation velocity for electrons, while the GaSb channel has a high mobility ($\simeq$1000 cm$^2$/V-s) and high saturation velocity for holes.

In order to take full advantage of this technology, for highly integrated digital ICs, a process for integration of n and p channel complementary devices is required. In standard complementary HFET technology, which is based on GaAs or InP, the magnitude of the source and drain access resistance are reduced by implanting donors or acceptors using the gate metal (e.g. titanium tungsten nitride, TiWN) as a mask. However, in some of the compound materials mentioned above, implanting impurities causes swelling of the implanted regions of the material. This swelling affects the electrical properties of the device and is known to be a major problem in the use of some compound materials for complementary FETs and the like.

It is a purpose of the present invention to provide a new and improved method of fabricating HFETs, and especially complementary HFETs, from compound semiconductor materials.

It is another purpose of the present invention to provide a new and improved method of fabricating HFETs, and especially complementary HFETs, from compound semiconductor materials without requiring implanting and the like.

It is another purpose of the present invention to provide new and improved HFET devices, and especially complementary HFETs, from compound semiconductor materials with no implants or the like.

SUMMARY OF THE INVENTION

The above problems and others are substantially solved and the above purposes and others are realized through a method of fabricating a heterojunction device including the steps of providing a supporting substrate structure defining a supporting surface, forming a first semiconductive layer of material on the supporting surface of the substrate structure including a conduction band and a valence band, each with a predetermined energy level, and a Fermi level to cause the first semiconductive layer to have a first type of conductivity, forming a first barrier layer on the first layer of semiconductor material, forming a second semiconductive layer on the first barrier layer including a conduction band and a valence band, each with a predetermined energy level, and a Fermi level to cause the second semiconductive layer to have a second type of conductivity opposite to the first type and forming a cap structure on the second semiconductive layer including a plurality of selected layers of semiconductor material.

A first gate electrode is positioned on the cap structure in a first area to define a first transistor having a first conduction channel of the second conductivity type in the second semiconductive layer and to provide a mask for subsequent etching. The cap structure is selected and etched to pin the Fermi level in the first conduction channel in the second semiconductive layer such that the number of carriers in the first conduction channel are substantially less than the number of carriers in surrounding portions of the second semiconductive layer. First source and drain electrodes are positioned on the first portion of the cap structure on opposite sides of the first gate electrode and electrically coupled to the first conduction channel.

A second gate electrode is positioned on the first portion of the cap structure in a second area, spaced from the first area, to define a second transistor having a second conduction channel of the first conductivity type in the first semiconductive layer and to provide a mask for subsequent etching. The cap structure is further selected and etched to pin the Fermi level in the second conduction channel in the first semiconductive layer such that the number of carriers in the second conduction channel are substantially less than the number of carriers in surrounding portions of the first semiconductive layer. Second source and drain electrodes are positioned on the second portion of the cap structure on opposite sides of the second gate electrode and electrically coupled to the second conduction channel.

The above problems and others are substantially solved and the above purposes and others are realized in a heterojunction device including a supporting substrate structure defining a supporting surface, a first semiconductive layer of material having a conduction band and a valence band, each with a predetermined energy level, and with a Fermi level and positioned on the supporting surface of the substrate structure, a first barrier layer positioned on the first semiconductive layer, a second semiconductive layer of material having a conduction band and a valence band, each with a predetermined energy level, and with a Fermi level and positioned on the first barrier layer, and a cap structure positioned on the second semiconductive layer and including a plurality of layers of selected semiconductor materials.

A first transistor having a conduction channel in the second semiconductive layer and a second transistor having a conduction channel in the first semiconductive layer are defined in the layers, with each of the first and second transistors including gate, source and drain electrodes. The cap structure is selected and etched to pin the Fermi level in the conduction channel of the first transistor such that carriers in the conduction channel of the first transistor are substantially less than carriers in surrounding portions of the second semiconductive layer and to pin the Fermi level in the conduction channel of the second transistor such that carriers in the conduction channel of the second transistor are substantially less than carriers in surrounding portions of the first semiconductive layer.

BRIEF DESCRIPTION OF THE DRAWINGS

Referring to the drawings:

FIG. 8 illustrates a band diagram of the structure shown in FIG. 7, along the line 8—8, with modified Fermi level;

FIG. 9 illustrates a band diagram of the structure shown in FIG. 7, along the line 9—9, with modified Fermi level;

FIG. 10 illustrates a band diagram of the structure shown in FIG. 7, along the line 10—10, with modified Fermi level.

DETAILED DESCRIPTION OF THE DRAWINGS

Figure 1:
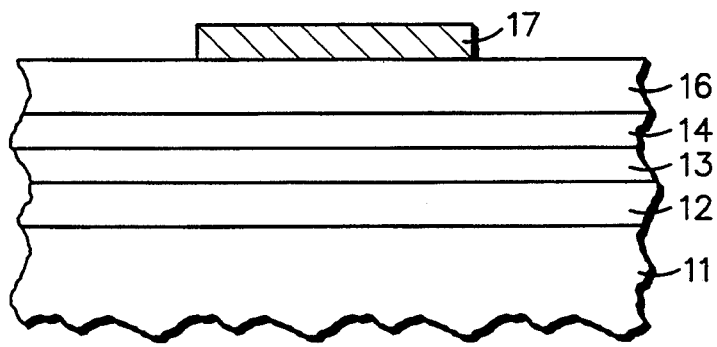
FIG. 1 illustrates a highly simplified cross section through a portion of a dual channel HFET.

A primary concern in the design of quantum well field effect transistors is the structure of the channel regions underneath the gate electrode as the channel region performance largely determines overall performance of the transistor. FIG. 1 illustrates a highly simplified cross section through channel regions above a heterojunction field effect transistor utilized herein for purposes of explanation. All material layers shown in FIG. 1, and subsequent embodiments of the present invention are substantially single crystal epitaxially grown layers. This requires that each epitaxial layer comprise a material which is crystalographically compatible with an underlying substrate. Therefore, in addition to electronic material constraints discussed hereinafter in this explanation and in regard to the particular embodiments to be described, it should be noted that material choice is also limited by crystal properties. The epitaxial layers of the present invention may be grown by metal organic chemical vapor deposition (MOCVD), molecular beam epitaxy (MBE), or atomic layer epitaxy (ALE), or the like.

The exemplary structure shown in FIG. 1 includes a wide band gap buffer layer 11 comprising a material such as aluminum antimonide (AlSb). Other wide band gap materials are known and may be used, but, as will be seen, AlSb is desirable in the described structures to ensure compatibility with other materials used in overlying layers therein. A P-channel quantum well 12, including gallium antimonide (GaSb) is formed covering AlSb buffer layer 11. P-channel quantum well 12 is covered by a barrier layer 13 having a predetermined thickness and comprising a material with a wide band gap such as AlSb. An N-channel quantum well 14 including indium arsenide (InAs) is formed over barrier layer 13. A second barrier layer 16, including a wide band gap material such as AlSb, is formed over N-channel quantum well 14. A gate electrode 17 is formed over a portion of second barrier 16 and makes a Schottky contact with second barrier layer 16. It should be noted that P-channel quantum well 12 and N-channel quantum well 14 are substantially undoped and that no charge supply layer need be placed in the barrier layers.

Figure 2:
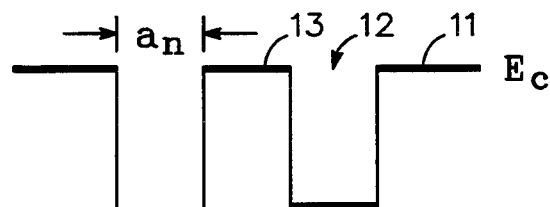
FIG. 2 illustrates a band diagram of the structure shown in FIG. 1 with no applied bias.

In this example, the particular materials for P-channel quantum well 12 and N-channel quantum well 14 are chosen so that P-channel quantum well 12 and N-channel quantum well 14 have predetermined valence and conduction band energy, respectively. Conduction band energy ($E_c$) and valence band energy ($E_v$) are illustrated in a bandgap diagram shown in FIG. 2, wherein the vertical axis represents relative energy in electron volts, and the horizontal axis represents thickness or depth within the device structure shown in FIG. 1. The left hand side of the drawing is the upper surface of layer 16, while the right hand side of the drawing is buffer layer 11. In FIG. 2 a first quantized energy level, also called a ground state energy, in P-channel quantum well 12 is identified by a line labeled $\epsilon_h$. Similarly, a first quantized energy level in N-channel quantum well 14 is identified by a line labeled $\epsilon_e$.

In the exemplary structure of FIG. 1, P-channel quantum well 12 and N-channel quantum well 14 are formed in a wide band gap host material comprising barriers 11, 13, and 16. The quantized energy level for a minimum energy, or first hole state indicated by line $\epsilon_h$ within P-channel quantum well 12 lies at an energy somewhat lower than valence band energy for P-channel quantum well 12. The precise energy for $\epsilon_h$ is determined by the thickness of P-channel quantum well 12, indicated by $a_p$ in FIG. 2. Likewise, $\epsilon_e$ indicates a quantized energy level for a minimum energy, or first electron state in N-channel quantum well 14. $\epsilon_e$ lies somewhat above conduction band energy for N-channel quantum well 14 and is also determined by thickness $a_n$ of N-channel quantum well 14. $\Delta\epsilon$ is an energy difference between valence band energy in P-channel quantum well 12 and conduction band energy in N-channel quantum well 14. When GaSb and InAs are used for the quantum wells, $\Delta\epsilon$ is about 0.15 eV.

As noted hereinbefore, $\epsilon_e$ and $\epsilon_h$ vary with thickness of the quantum wells. As quantum well 12 becomes thinner, $\epsilon_h$ becomes more separated from $E_v$. Likewise, as quantum well 14 becomes thinner, $\epsilon_e$ becomes more separated from $E_C$. This aspect of the structure shown in FIG. 1 can be used to create HFET structures having both depletion mode and enhancement mode characteristics.

Figure 3:
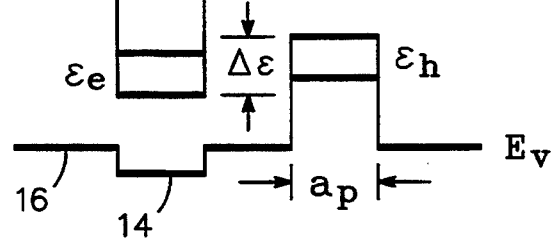
FIG. 3 illustrates, in graphical form, a relationship between quantized energy of a first hole state in a P-channel quantum well and a quantized energy of an electron state in an N-channel well as a function of quantum well thickness.

FIG. 3 graphically illustrates the relative energy difference between $\epsilon_e$ and $\epsilon_h$ as quantum well thickness is changed. The graph in FIG. 3 illustrates quantum well thickness on the horizontal axis, assuming that both quantum wells are the same thickness (a) for ease of illustration. The vertical axis in FIG. 3 represents energy difference between first hole state $\epsilon_h$ in P-channel quantum well 12 and first electron state $\epsilon_e$ in N-channel quantum well 14. It can be seen in FIG. 3 that at some critical thickness $a_c$, $\epsilon_h$ and $\epsilon_e$ are at the same energy. This critical thickness is about 100 angstroms for the materials described in the preferred embodiments. As quantum well thickness increases $\epsilon_h$ becomes increasingly greater than $\epsilon_e$ and self-doping will occur, as explained in more detail in U.S. Pat. No. 5,142,349, entitled "Self-Doped High Performance Complementary Heterojunction Field Effect Transistor", issued Aug. 25, 1992 and incorporated herein by reference. When quantum wells 12 and 14 are sufficiently thin, $\epsilon_h$ is less than $\epsilon_e$ in an unbiased condition. Thus, when quantum wells 12 and 14 are thin, P-channel quantum well 12 and N-channel quantum well 14 are undoped and non-conductive absent an external bias.

Figure 4:
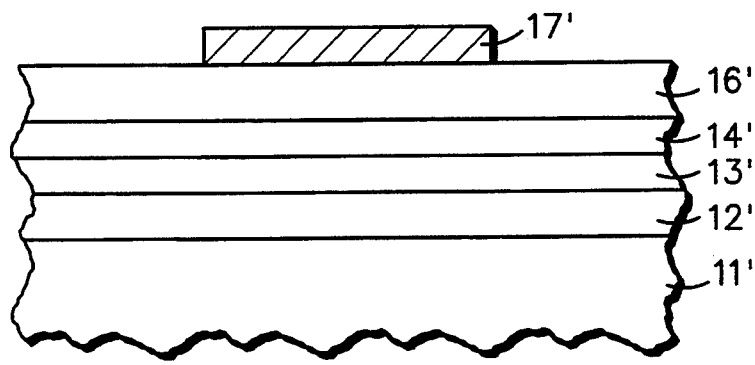
FIG. 4 illustrates a highly simplified cross section through a portion of a dual channel HFET.
Figure 5:
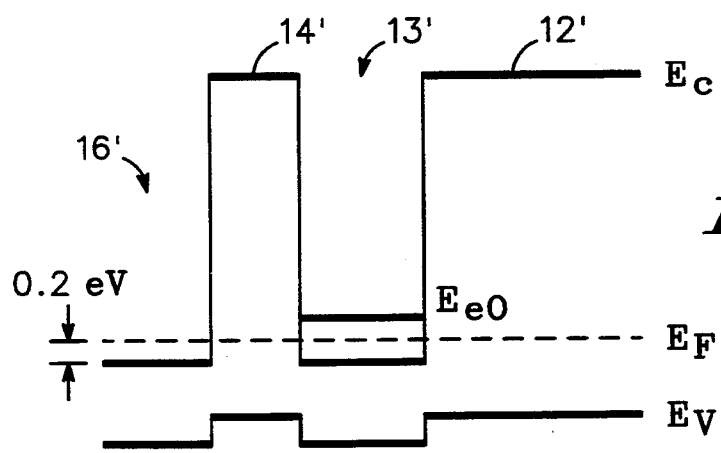
FIGS. 5 and 6 illustrate band diagrams of the structure shown in FIG. 4 with different surface layers.

Other semiconductor materials that have different surface pinning levels will alter the concentration of charge in the quantum well. In addition, when a very thin layer of one semiconductor material is formed on top of another material, a pinning position that is different than either one of the original materials may obtain. FIG. 4 illustrates and exemplary structure including a substrate layer 11' and a wide bandgap buffer layer 12' comprising a material such as aluminum antimonide (AlSb) An n-channel quantum well 13', including indium arsenide (InAs), is formed over buffer layer 12'. A barrier layer 14', including a wide bandgap material, such as AlSb, is formed over n-channel quantum well 13'. A thin cap layer 16', including either InAs or GaSb, is formed on top of barrier layer 14'. A gate electrode 17' is formed over a portion of cap layer 16'. The position of the Fermi level in the various layers is determined by the material on the surface. When the surface layer is composed of InAs, the Fermi level is pinned at 0.2 eV above the conduction band of InAs. When the surface layer is composed of thin GaSb on top of AlSb, the Fermi level pinning is experimentally observed to be approximately 0.85 eV below the conduction band of AlSb. The Fermi level of thick GaSb lies at 0.1 eV above the valence band of GaSb. Conduction band energy (Ec) and valence band energy (Ev) are illustrated in a band diagram shown in FIG. 5 for the structure having a cap layer of InAs. The quantized energy level in the InAs quantum well 13' is designated $E_{e0}$. In this structure the quantized energy level is above the Fermi level resulting in a very low concentration of electrons in the InAs quantum well.

Figure 6:
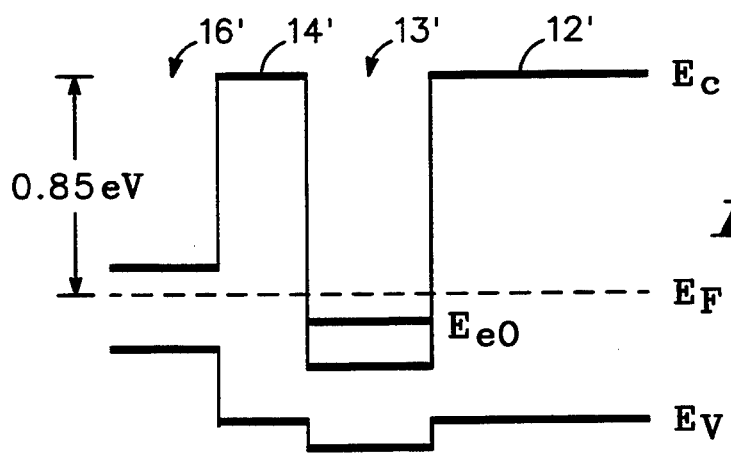

When the cap layer is a thin layer of GaSb, the surface Fermi level is 0.85 eV below the conduction band of AlSb as shown in FIG. 6. In this structure the Fermi level is much higher than the quantized level $E_{e0}$ in InAs and a very high concentration of electrons is induced in the InAs quantum well. By exposing (through selective etching) various semiconductive material layers (e.g., InAs or GaSb) in selected regions of the device, the carrier concentration in those regions of the device necessary for proper device performance can be achieved.

Figure 7:
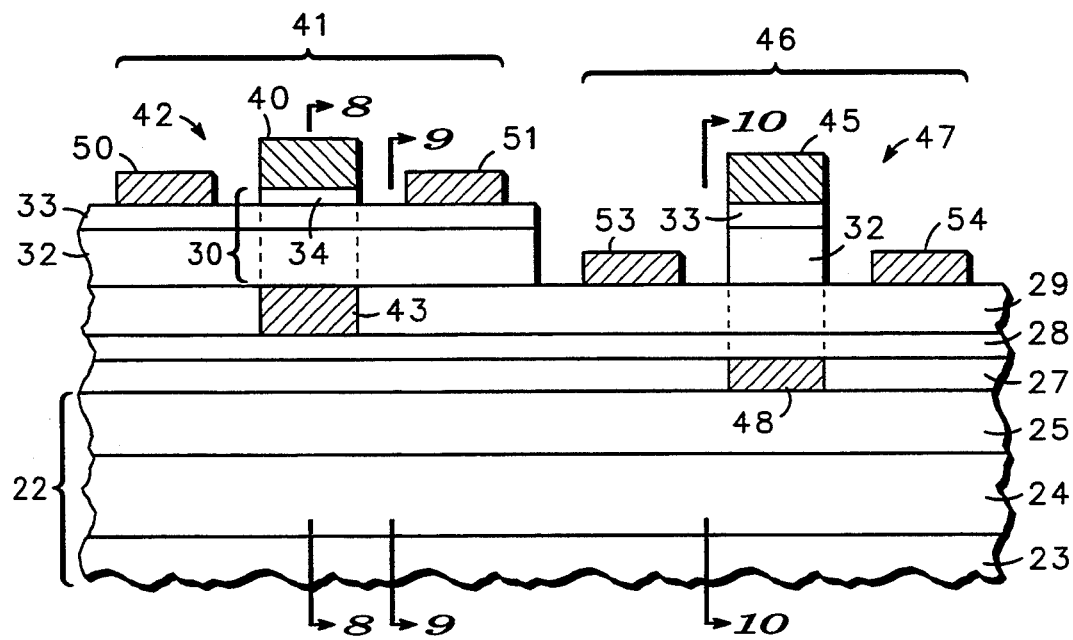
FIG. 7 illustrates a highly simplified cross-section through a complementary heterojunction device incorporating the present invention.

A highly simplified cross-section through a complimentary heterojunction device 20, incorporating the present invention, is illustrated in FIG. 7. Device 20 is formed on a supporting substrate structure 22 including a supporting substrate 23, a buffer layer 24 and a barrier layer 25. As explained above, buffer layer 24 is generally utilized to insure that subsequent layers are compatible with underlying substrate 23. Barrier layer 25 is utilized to provide an adequate barrier, or energy gap width, to prevent the leakage of carrier's into buffer layer 24. It will be understood by those skilled in the art that some modifications in widths and materials may result in a somewhat different substrate structure, but the purposes will remain generally the same.

A semiconductive layer 27 is deposited on the upper surface of substrate structure 22 (barrier layer 25), a barrier layer 28 is deposited on the upper surface of semiconductive layer 27 and a second semiconductive layer 29 is deposited on the upper surface of barrier layer 28. A cap structure 30 is then deposited on the upper surface of semiconductive layer 29. Cap structure 30 is formed with a plurality of selected layers of semiconductor material which in this specific embodiment, includes a barrier layer 32, a first cap layer 33 and a second cap layer 34.

A gate electrode 40 is deposited on the upper surface of cap structure 30 (second cap layer 34) and positioned in an area 41 to define a transistor 42 having a conduction channel 43 in semiconductive layer 29. Gate electrode 40 is utilized as a mask to etch, or remove, second cap layer 34 at least within area 41 and, in this specific embodiment across the entire device 20. The removal of second cap layer 34 exposes first cap layer 33 over the entire device 20, except under gate electrode 40. In this preferred embodiment, area 41 is then protected by any of the well known methods for selectively etching and/or depositing and a gate electrode 45 is deposited on the upper surface of first cap layer 33. Gate electrode 45 is further positioned in an area 46, spaced from area 41, to define a transistor 47 having a conduction channel 48 in semiconductive layer 27. With gate electrode 45 in place and area 41 protected, as described above, first cap layer 33 and barrier layer 32 are etched, or removed, to expose the surface of semiconductive layer 29.

A source electrode 50 and a drain electrode 51, for transistor 42 are selectively deposited on the upper surface of first cap layer 33. A source electrode 53 and a drain electrode 54, for transistor 47 are selectively deposited on the upper surface of semiconductive layer 29. As is understood in the art, electrodes 50, 51, 53 and 54 form ohmic contacts with the material on which they are positioned. Further, as will be understood, source electrode 50 and drain electrode 51 are electrically coupled to semiconductive layer 29 through first cap layer 33 and barrier layer 32 by the ohmic contact. Also, source electrode 53 and drain electrode 54 are electrically coupled to semiconductive layer 27 by the ohmic contact.

Semiconductive layer 29 is selected, in this specific embodiment, to have a Fermi level situated in the conduction band, so that the material of semiconductive layer 29 is n-type material. Similarly, semiconductive layer 27 is selected to have a Fermi level situated in the valance band, so that the material of semiconductive layer 27 is p-type material. It will of course be understood that the n-type and p-type materials could be reversed, if desired. Also, while the present embodiment illustrates complimentary transistors for exemplary purposes, it will be understood that in some special applications it may be desirable to fabricate one or more similar transistors in a single device.

Cap structure 30 is specifically selected (i.e., the number of layers and materials) so that the surface material (i.e., second cap layer 34) overlying conduction channel 43 pins the Fermi level in conduction channel 43 such that the number of carriers in conduction channel 43 are substantially less than the number of carriers in surrounding semiconductive layer 29. Further, cap structure 30 is specifically selected and etched in area 41 so that the surface material (i.e., first cap layer 33) overlying surrounding semiconductive layer 29 in area 41 pins the Fermi level in semiconductive layer 29 surrounding conduction channel 43 in area 41 in a position to enhance the number of carriers therein. The enhanced carriers in semiconductive layer 29 provide low resistance access regions connecting source electrode 50 and drain electrode 51 to conduction channel 43.

Similarly, cap structure 30 is specifically selected and etched so that the surface material (i.e., first cap layer 33) overlying conduction channel 48 pins the Fermi level in conduction channel 48 such that the number of carriers in conduction channel 48 are substantially less than the number of carriers in surrounding semiconductive layer 27. Further, cap structure 30 is specifically selected and etched in area 46 so that the surface material (i.e., semiconductive layer 29) overlying surrounding semiconductive layer 27 in area 46 pins the Fermi level in semiconductive layer 27 surrounding conduction channel 48 in area 46 in a position to enhance the number of carriers therein. The enhanced carriers in semiconductive layer 27 provide low resistance access regions connecting source electrode 53 and drain electrode 54 to conduction channel 48. In both conduction channel 43 and conduction channel 48, the number of carriers (with no bias applied to gate electrodes 40 and 45) is small enough to prevent source-drain current flow in transistors 42 and 47, respectively. When normal bias potentials are applied to gate electrodes 40 and 45, normal current flow occurs. Thus, conduction between source electrode 50 and drain electrode 51 in conduction channel 43 is controllable by first gate electrode 40 and conduction between source electrode 53 and drain electrode 54 in conduction channel 48 is controllable by gate electrode 45.

The selection and etching of cap structure 30 to pin the Fermi level in the various covered layers, is dictated by the energy level at which it is desired to pin the Fermi level and the specific device being fabricated. To pin the Fermi level at a desired energy level, it has been found through experimentation that a surface layer of InAs causes the Fermi level in underlying layers to be pinned at a level approximately 0.2 above the conduction band of InAs. Dual layers of compound material, GaSb/AlSb, cause the Fermi level in underlying layers to be pinned at a level approximately 0.85 below the conduction band of AlSb. A thick surface layer of GaSb causes the Fermi level in underlying layers to be pinned at a level approximately 0.1 above the valance band of GaSb. It will of course be understood that other compound materials or combinations of compound materials can be utilized to provide different results.

As a specific example of materials utilized in complimentary device 20, in substrate structure 22, the material making up substrate 23 is GaAs or InP, buffer layer 24 is AlSb and barrier layer 25 is approximately 100 Å of AlSb. Semiconductive layer 27 is approximately 80 Å of GaSb, barrier layer 28 is approximately 40 Å of AlSb and semiconductive layer 29 is approximately 100 Å of InAs. Cap structure 30 is selected to include barrier layer 32 formed of approximately 100 Å of AlSb, first cap layer 33 formed of approximately 50 Å of GaSb and second cap layer 34 formed of approximately 30 Å of InAs.

Band diagrams of the structure shown in FIG. 7, taken along lines 8—8, 9—9 and 10—10 are illustrated in FIGS. 8, 9 and 10, respectively. FIGS. 8, 9 and 10 illustrate Fermi levels modified in accordance with the surface material at lines 8—8, 9—9 and 10—10. In FIG. 8, it can be seen that the Fermi level is pinned by second cap layer 34 at the surface such that the electron concentration in conduction band 43 is low while the hole concentration in semiconductive layer 27 underlying conduction band 43 is relatively high. In FIG. 9, it can be seen that the Fermi level is pinned by first cap layer 33 at the surface such that the electron concentration in semiconductive layer 29 adjacent to conduction channel 43 is high while the hole concentration in the underlying semiconductive layer 27 is relatively low. Also, in relation to transistor 47, the concentration of carriers in conduction channel 48 and underlying layers will be similar to that illustrated in FIG. 9, since the surface material is similar. In FIG. 10, it can be seen that the Fermi level is pinned by semiconductive layer 29 at the surface such that the hole concentration in semiconductive layer 27 adjacent to conduction channel 48 is high while the electron concentration in the overlying semiconductive layer 29 is relatively low.

In the above specific example, complementary device 20 was found to have the following approximate numbers of carriers, with no bias applied to gate electrodes 40 and 45. Conduction channel 43, which is enhancement mode n-type conductivity, has an electron density of $10^9/cm^2$ while the surrounding portions of semiconductive layer 29 in area 41 have an electron density of $10^{12}/cm^2$. Conduction channel 48, which has enhancement mode p-type conductivity, has a hole density of $10^{10}/cm^2$, while the surrounding portions of semiconductive layer 27 in area 46 have an electron density of $10^{12}/cm^2$. Thus, it can be seen that transistors 42 and 47 are normally off since there are substantially fewer carriers in conduction channels 43 and 48. Further, the surrounding portions of semiconductive layers 29 and 27, respectively, have substantially more carriers and, therefore, form a low resistance access region for contact with source and drain terminals.

It should also be noted that the carrier concentration in the unused portions of semiconductive layers 27 and 29 in transistor 42 or 47 is such that unwanted current can not flow. In the specific example illustrated above, the hole concentration in semiconductive layer 27 underlying conduction channel 43 is approximately $7 \times 10^{11}/cm^2$ while the surrounding portions have a hole concentration of approximately $10^{10}/cm^2$. Similarly, the electron concentration in semiconductive layer 29 overlying conduction channel 48 is approximately $10^{12}/cm^2$ while the surrounding portions have an electron concentration of approximately $2 \times 10^7/cm^2$.

Figure 11:
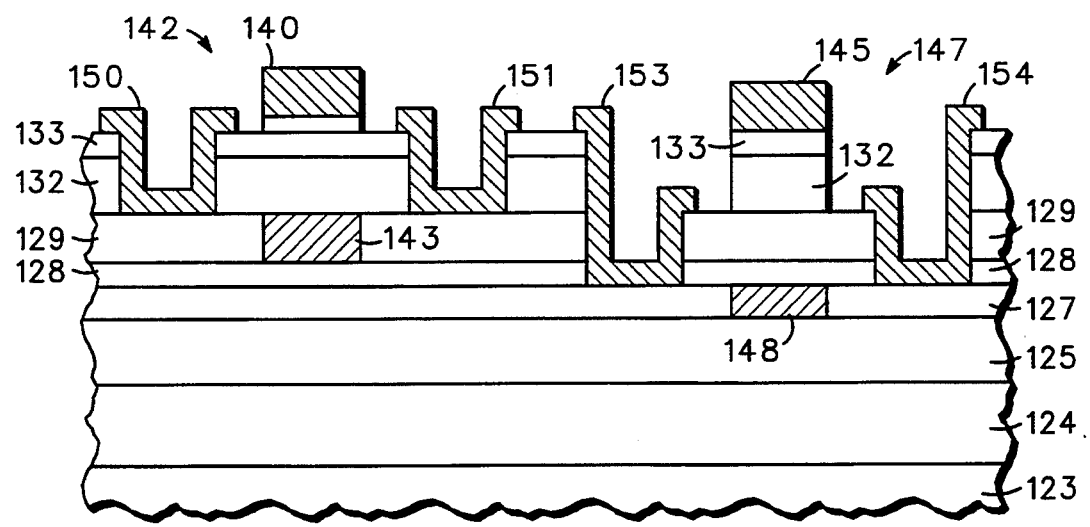
FIG. 11 illustrates a highly simplified cross-section through another embodiment of a complimentary heterojunction device incorporating the present invention.

Another embodiment of a complimentary device 120 embodying the present invention is illustrated in FIG. 11. Much of complimentary device 120 is similar to complimentary device 20 illustrated in FIG. 7 and, therefore, similar parts are designated with similar numbers having a prefix, 1, added to indicate a different embodiment. In complimentary device 120, instead of simply depositing source and drain ohmic contacts on the surfaces of the device, openings are etched through first cap layer 133 and barrier layer 132 on either side of gate electrode 140 to expose portions of semiconductive layer 129. Source and drain terminals 150 and 151,respectively, are deposited on first cap layer 133 and on the exposed surface of semiconductor layer 129 in the openings to form very low resistance access regions in transistor 142. Similarly, openings are etched through semiconductive layer 129 and barrier layer 128 on either side of gate electrode 145 to expose portions of semiconductive layer 127. Source and drain terminals 153 and 154, respectively, are deposited on semiconductive layer 129 and on the exposed surface of semiconductor layer 127 in the openings to form very low resistance access regions in transistor 142. Also, source terminal 153 is extended upward onto first cap layer 133 to illustrate that it could easily be directly connected to drain terminal 151 of transistor 142, in the case of complimentary transistors.

Thus, a new and improved method of fabricating HFETs, and especially complementary HFETs, from compound semiconductor materials is disclosed. Further, a new and improved method of fabricating HFETs, and especially complementary HFETs, from compound semiconductor materials without requiring implanting and the like is disclosed. Thus, the problems of material swelling are eliminated. Further, in the present method the materials are selected to minimize the masking and other process steps, which substantially simplifies fabrication of complementary devices as well as much more complicated integrated circuits.

Although the present embodiments are described in terms of complementary structures having a single N-channel and a single P-channel device, it should be understood that a variety of complementary and non-complementary structures can be provided with slight modifications. These modifications are easily understood by those of skill in the art, and are intended to be encompassed within the scope of the present invention. Further, both enhancement and depletion devices may be manufactured in the vertically stacked structure. Also, the layers may be provided in any order to achieve desired device function.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a heterojunction device comprising the steps of:
   providing a supporting substrate structure defining a supporting surface;
   forming a first semiconductive layer of material on the supporting surface of the substrate structure, the first semiconductive layer including a conduction band and a valence band, each with an energy level, and a Fermi level to cause the first semiconductive layer to have a first type of conductivity;
   forming a first barrier layer on the first layer of semiconductor material;
   forming a second semiconductive layer on the first barrier layer, the second semiconductive layer including a conduction band and a valence band, each with an energy level, and a Fermi level to cause the second semiconductive layer to have a second type of conductivity opposite to the first type;
   forming a cap structure on the second semiconductive layer, the cap structure including a plurality of layers of semiconductor material;
   positioning a first gate electrode on the cap structure in a first area to define a first transistor having a first conduction channel of the second conductivity type in the second semiconductive layer;
   etching a first portion of the cap structure, using the first gate electrode as a mask, the cap structure being selected and etched to pin the Fermi level in the first conduction channel in the second semiconductive layer such that the number of carriers in the first conduction channel are substantially less than the number of carriers in surrounding portions of the second semiconductive layer;
   depositing a first source and a first drain electrode on the first portion of the cap structure on opposite sides of the first gate electrode and electrically coupling the first source and first drain electrodes to the first conduction channel;
   positioning a second gate electrode on the first portion of the cap structure in a second area to define a second transistor having a second conduction channel of the first conductivity type in the first semiconductive layer;
   etching a second portion of the cap structure, using the second gate electrode as a mask, the cap structure being selected and etched to pin the Fermi level in the second conduction channel in the first semiconductive layer such that the number of carriers in the second conduction channel are substantially less than the number of carriers in surrounding portions of the first semiconductive layer; and
   depositing a second source and a second drain electrode on the second portion of the cap structure on opposite sides of the second gate electrode and electrically coupling the second source and second drain electrodes to the second conduction channel.

2. A method of fabricating a heterojunction device as claimed in claim 1 wherein the step of forming a cap structure includes selecting the cap structure to pin the Fermi level in the second semiconductive layer such that the number of carriers in the second semiconductive layer are substantially greater than the number of carriers in the first conduction channel of the second semiconductive layer to provide low resistance access regions between the first drain and source electrodes and the first conduction channel.

3. A method of fabricating a heterojunction device as claimed in claim 2 wherein the step of forming a cap structure includes selecting the cap structure to pin the Fermi level in the first semiconductive layer, beneath the first drain and first source electrodes, such that substantially no conduction occurs in the first semiconductive layer beneath the first transistor.

4. A method of fabricating a heterojunction device as claimed in claim 1 wherein the step of forming a cap structure includes selecting the cap structure to pin the Fermi level in the first semiconductive layer such that the number of carriers in the first semiconductive layer are substantially greater than the number of carriers in the second conduction channel of the first semiconductive layer to provide low resistance access regions between the second drain and source electrodes and the second conduction channel.

5. A method of fabricating a complimentary heterojunction device comprising the steps of:
   providing a supporting substrate structure defining a supporting surface;
   forming a first semiconductive layer of material on the supporting surface of the substrate structure, the first semiconductive layer including a first layer of semiconductor material having a conduction band and a valence band, each with a predetermined energy level, and with a Fermi level in the valence band to cause the first semiconductive layer to have a first type of conductivity;
   forming a first barrier layer on the first semiconductive layer;

forming a second semiconductive layer on the first barrier layer, the second semiconductive layer including a second layer of semiconductor material having a conduction band and a valence band, each with a predetermined energy level, and with a Fermi level in the conduction band to cause the second semiconductive layer to have a second type of conductivity opposite to the first type;

forming a cap structure on the second semiconductive layer, the cap structure including a second barrier layer positioned on the second semiconductive layer, a first cap layer positioned on the second barrier layer and a second cap layer positioned on the first cap layer;

selecting a first area for a first complimentary heterojunction FET of a first conductivity type, and forming a first gate electrode on the second cap layer to define a first conduction channel for the first heterojunction FET in the second semiconductive layer;

etching the second cap layer of the cap structure, utilizing the first gate electrode as a mask, and forming a first source and a first drain electrode on opposite sides of the first gate electrode on the first cap layer, the second and first cap layers being selected to pin the Fermi level in the first conduction channel such that number of carriers in the first conduction channel are substantially less than number of carriers in surrounding portions of the second semiconductive layer, whereby the first source and first drain electrodes are electrically coupled to the first conduction channel and conduction between the first source and first drain electrodes in the first conduction channel is controllable by the first gate electrode;

selecting a second area, spaced from the first area, for a second complimentary heterojunction FET of a second conductivity type different than the first conductivity type and forming a second gate electrode on the first cap layer;

etching the first cap layer of the cap structure and the second barrier layer of the cap structure in the second area, utilizing the second gate electrode as a mask, and forming a second source and a second drain electrode on opposite sides of the gate electrode on the second semiconductive layer, the first cap layer being selected to pin the Fermi level in the second conduction channel such that number of carriers in the second conduction channel are substantially less than number of carriers in surrounding portions of the first semiconductive layer, whereby the second source and second drain electrodes are electrically coupled to the second conduction channel and conduction between the second source and second drain electrodes in the second conduction channel is controllable by the second gate electrode.

6. A method of fabricating a complimentary heterojunction device as claimed in claim 5 wherein the step of providing a supporting substrate structure defining a supporting surface includes the steps of providing a substrate, forming a buffer layer on a surface of the substrate and forming a barrier layer on a surface of the buffer layer.

7. A method of fabricating a complimentary heterojunction device as claimed in claim 6 wherein the steps of providing a substrate includes providing a substrate formed of a material selected from the group GaAs, InP and GaSb, forming a buffer layer includes forming the buffer layer of AlSb or GaSb and forming a barrier layer on a surface of the buffer layer includes forming the barrier layer of one of AlSb and AlGaSb.

8. A method of fabricating a complimentary heterojunction device as claimed in claim 7 wherein the steps of forming a first conduction channel includes forming the first semiconductive layer of GaSb, forming a first barrier layer includes forming the first barrier layer of one of AlSb and AlGaSb, and forming a second conduction channel includes forming the second semiconductive layer of InAs.

9. A method of fabricating a complimentary heterojunction device as claimed in claim 8 wherein the step of forming a cap structure includes the step of forming, on the second semiconductive layer, a second barrier layer of one of AlSb and AlGaSb.

10. A method of fabricating a complimentary heterojunction device as claimed in claim 9 wherein the step of forming a cap structure further includes the step of forming a first cap layer of GaSb positioned on the second barrier layer of the cap structure.

11. A method of fabricating a complimentary heterojunction device as claimed in claim 10 wherein the step of forming a cap structure further includes the step of forming a second cap layer of InAs positioned on the first cap layer of GaSb of the cap structure.

12. A method of fabricating a complimentary heterojunction device as claimed in claim 5 wherein the step of forming a first source and a first drain electrode on opposite sides of the first gate electrode on the second cap layer includes the steps of etching an opening through the second cap layer and the second barrier layer in the cap structure to expose a portion of the second semiconductive layer for each of the source and drain electrodes and forming source and drain electrodes on the second cap layer and in contact with the exposed portion of the second semiconductive layer in the openings.

13. A method of fabricating a complimentary heterojunction device as claimed in claim 12 wherein the step of forming a second source and a second drain electrode on opposite sides of the second gate electrode on the second layer of semiconductor material includes the steps of etching an opening through the second semiconductive layer and through the first barrier layer for each of the source and drain electrodes to expose a portion of the first semiconductive layer and forming source and drain electrodes on the second semiconductive layer and in contact with the exposed portion of the first semiconductive layer in the openings.

* * * * *